(12) United States Patent
Megaw

(10) Patent No.: US 7,088,146 B1
(45) Date of Patent: Aug. 8, 2006

(54) APPARATUS AND METHOD FOR HIGH-SPEED HALF-LATCH WITH LOW OVERDRIVE VOLTAGE

(75) Inventor: David James Megaw, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/981,271

(22) Filed: Nov. 3, 2004

(51) Int. Cl.
*H03K 5/22* (2006.01)
(52) U.S. Cl. .............................. 327/67; 327/65; 327/563
(58) Field of Classification Search ................. 327/65, 327/67, 57, 563
See application file for complete search history.

(56) References Cited

U.S. PATENT DOCUMENTS

| 5,245,223 A | * | 9/1993 | Lim et al. ..................... 327/202 |
| 6,559,719 B1 | * | 5/2003 | Sakuragi ....................... 327/563 |

* cited by examiner

*Primary Examiner*—Long Nguyen
(74) *Attorney, Agent, or Firm*—Darby & Darby, P.C.; Matthew M. Gaffney

(57) ABSTRACT

A half-latch that includes negative feedback circuitry is provided. The negative feedback circuitry causes the steady-state gain of the half-latch to remain high so that the overdrive voltage needed to change the state of the half-latch is significantly reduced. Additionally, the negative feedback is bypassed by capacitors at high frequencies so that the speed of the half-latch is substantially unaffected by the negative feedback.

20 Claims, 3 Drawing Sheets ized only by the scope of the claims attached hereto.

APPARATUS AND METHOD FOR HIGH-SPEED HALF-LATCH WITH LOW OVERDRIVE VOLTAGE

FIELD OF THE INVENTION

The invention is related to latches, and in particular, to a half-latch circuit employing negative feedback so that the overdrive voltage needed to change states is reduced.

BACKGROUND OF THE INVENTION

High-speed comparators frequently rely on some form of regeneration (positive feedback) to simultaneously achieve high speed and high gain. A latch employing positive feedback is often used as the last stage of high-speed comparators to provide regeneration as well as rail-to-rail swing. The outputs of the half-latch may be driven to either the positive or negative supply in each of its stable states, causing the steady-state gain of the latch to be very low. Typically, an extremely large overdrive voltage is required to change the latch from one stable state to another due to the low gain, and the speed of the latch is also degraded by the relatively slow transition from the low gain region of operation to the high gain region of operation.

In order to mitigate these effects, some form of active restore is generally used to hold the latch in its high gain region until a decision must be made. In situations where a comparator must be continuous, large amounts of pre-amplification are typically required to maintain comparator sensitivity and still generate the overdrive voltages required to drive the latch. However, higher preamplifier gain may cause larger propagation delay due to either a higher gain per stage and/or a higher number of gain stages.

BRIEF DESCRIPTION OF THE DRAWINGS

Non-limiting and non-exhaustive embodiments of the present invention are described with reference to the following drawings, in which.

DETAILED DESCRIPTION

Figure 1:
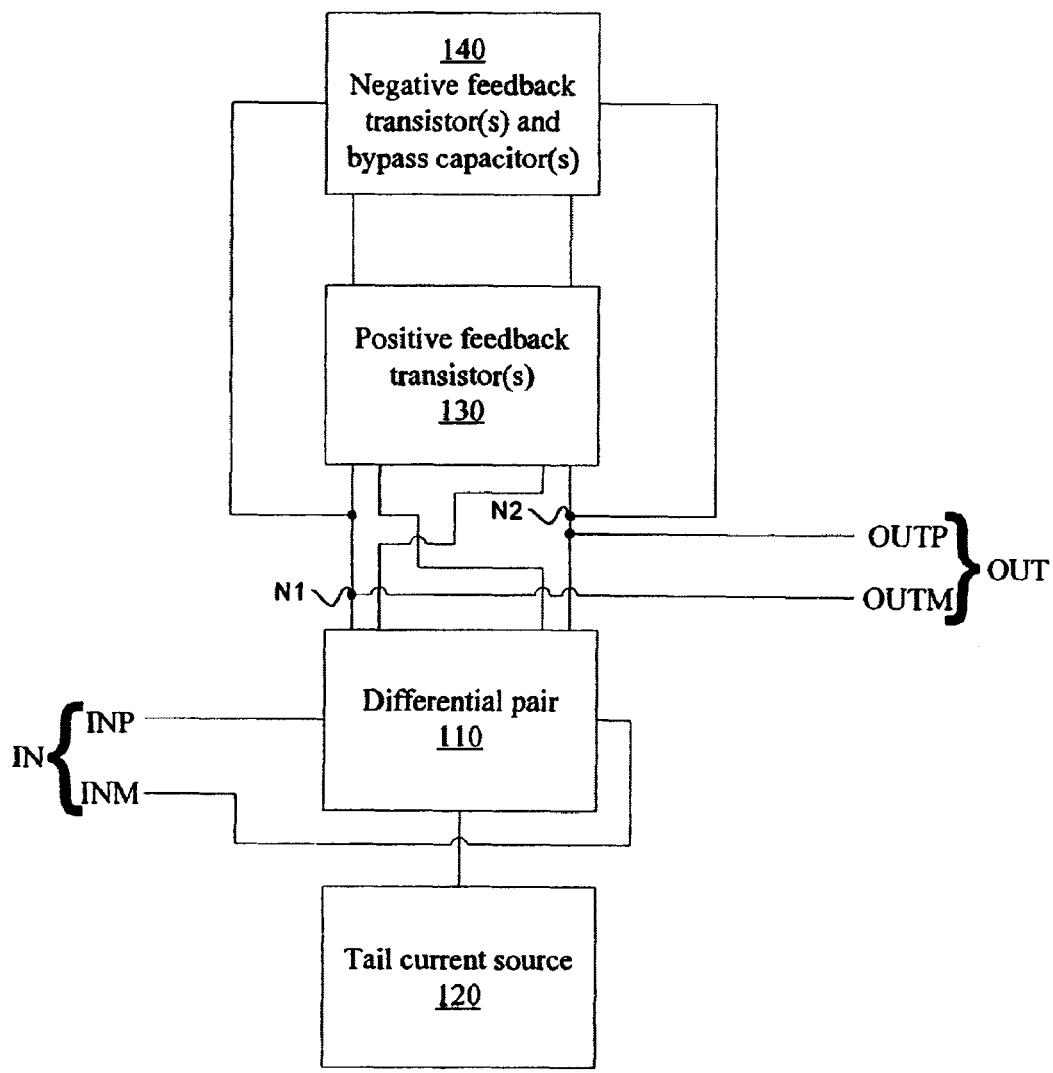
FIG. 1 shows a block diagram of an embodiment of a latch circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a half-latch that includes negative feedback circuitry. The negative feedback circuitry causes the steady-state gain of the half-latch to remain high during stable states so that the overdrive voltage needed to change the state of the half-latch is significantly reduced. Additionally, the negative feedback is bypassed by capacitors at high frequencies so that the speed of the half-latch is substantially unaffected by the negative feedback.

FIG. 1 shows a block diagram of an embodiment of latch circuit 100. Latch circuit 100 includes differential pair 110; positive feedback transistor(s) 130; block 140, which includes negative feedback transistor(s) and bypass capacitor(s); and optional tail current source 120. In one embodiment, latch circuit 100 is a half-latch with positive and negative feedback.

In operation, latch circuit 100 provides differential output signal OUT from differential input signal IN. Differential output signal OUT includes first half OUTP and second half OUTM. Similarly, differential input signal IN includes first half INP and second half INM.

In one embodiment, differential pair 110 operates as an operational transconductance amplifier (OTA) circuit to provide a differential current at nodes N1 and N2 in response to a differential voltage (signal IN). In this embodiment, positive feedback transistor(s) 130 and block 140 operate as an active load which provides a differential output voltage (signal OUT) at nodes N1 and N2 based on the differential current.

In one embodiment, tail current source 120 is included in latch circuit 100 to limit power consumption. In another embodiment, current source 120 is not included in latch circuit 100.

Positive feedback transistor(s) 130 are arranged to provide positive feedback such that latch circuit 100 has two stable states. Also, positive feedback transistor(s) 130 may be arranged to provide the positive feedback such that signal OUT corresponds to a first differential voltage during a first of the two stable states, and to a second differential voltage during a second of the two stable state. In one embodiment, in one of the stable states, the voltage at N1 is roughly VSS and voltage at node N2 is roughly VDD. In this embodiment, in the other stable state, the voltage at N1 is roughly VDD and voltage at node N2 is roughly VSS. The voltages at nodes N1 and N2 may not swing completely rail-to-rail since block 140 may cause some clamping.

If block 140 were not present in latch circuit 100, there may be a large imbalance between the load impedance at node N1 and the load impedance at node N2. The negative feedback transistors(s) in block 140 are arranged to roughly balance the differential load impedance (i.e. cause the load impedance and nodes N1 and N2 to be roughly similar) during both stable states.

Additionally, the bypass capacitor(s) in block 140 are arranged to substantially short the negative feedback transistor(s) in block 140 if a relatively fast transition from the first stable state to the second stable state occurs, and/or if a relatively fast transition from the second stable state to the first stable state occurs.

Figure 2:
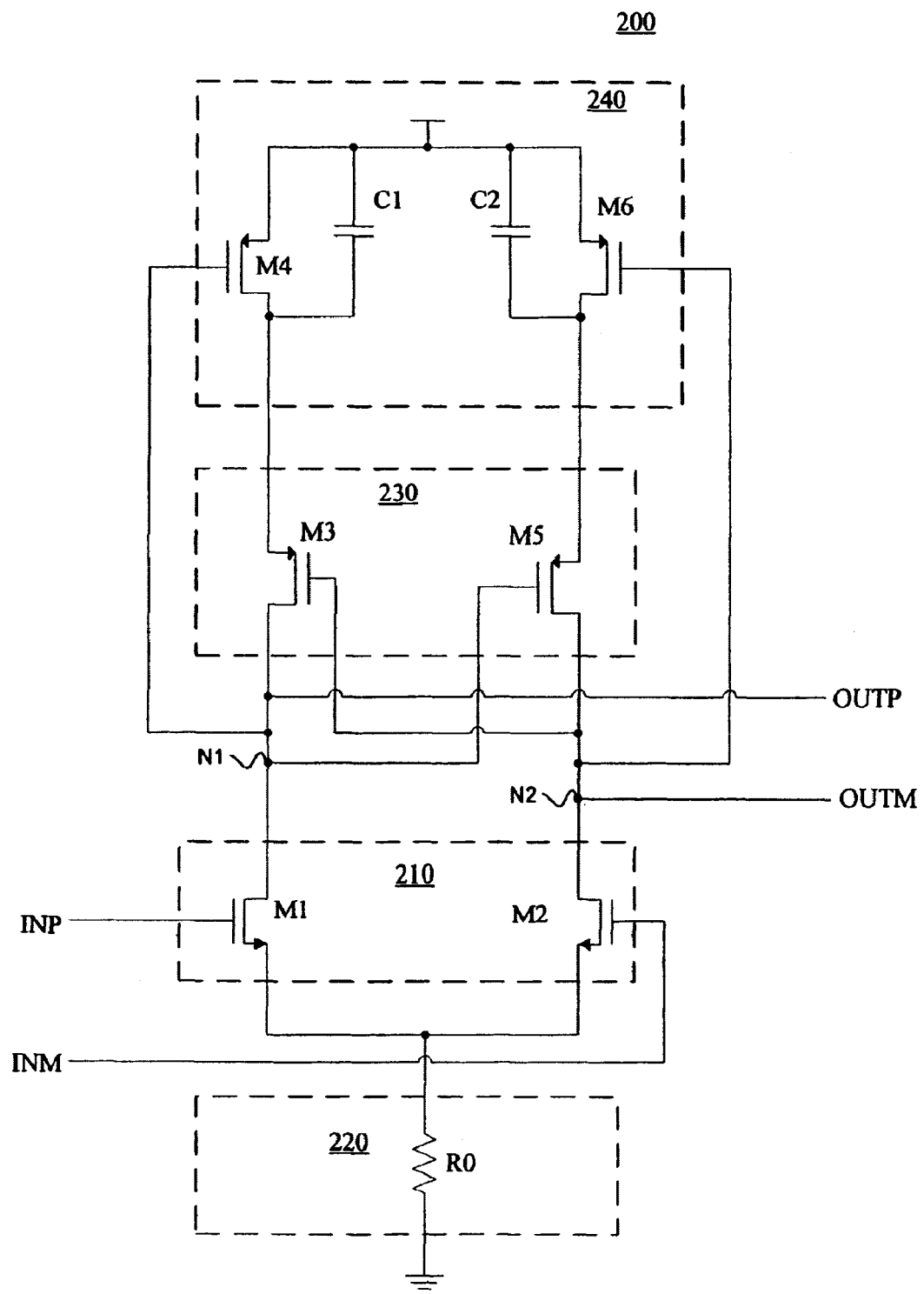
FIG. 2 illustrates a schematic diagram of an embodiment of the latch circuit of FIG. 1.

FIG. 2 illustrates a schematic diagram of an embodiment of latch circuit 200. An embodiment of latch circuit 200 may be employed as an embodiment of latch circuit 100 of FIG. 1. Differential pair 210 includes transistors M1 and M2. Tail current source 220 includes resistor R0. Also, positive feedback transistor(s) 230 include transistors M3 and M5. Block 240 includes transistors M4 and M6 and capacitors circuits C1 and C2.

Latch circuit 200 has its highest gain when the differential load impedance is balanced. "Gain" refers to instantaneous voltage gain (dOUT/dIN). In each of the two stable states of latch circuit 200, one of the two output nodes (N1 and N2) is driven roughly to the positive supply and the other is driven roughly to the negative supply. If block 240 were not included in latch circuit 200, this would cause a large imbalance in load impedance since one of the transistors in block 230 is in deep triode (minimum impedance) and the other is in cutoff (maximum impedance). By roughly balancing the differential load, the overdrive voltage (i.e., the amount of differential voltage needed in signal IN to change the state of latch circuit 200 from one stable state to the other) may be reduced by an order of magnitude or two.

The load impedance of the half-latch 200 is roughly balanced, as may be understood by examining the latch circuit 200 qualitatively. An increase in voltage OUTP leads to a corresponding decrease in voltage OUTM. The drain-to-source impedance of transistor M5 increases in response to the increase in voltage OUTP. Likewise, the drain-to-source impedance of transistor M3 decreases due to the decrease in voltage OUTM. The drain-to-source impedance of transistor M4 increases due to the increase in voltage OUTP, and the drain-to-source impedance of transistor M6 decreases with the decrease in OUTM. Assuming infinite incremental resistance for the transistors M1 and M2, the load impedance seen at nodes N1 and N2 (R1 and R2, respectively) may be given by:

$$R1 = R_{DS3} + (1 + gm_3 * R_{DS3}) * R_{DS4}; \text{ and}$$

$$R2 = R_{DS5} + (1 + gm_5 * R_{DS5}) * R_{DS6}.$$

Qualitatively, R1 is approximately the series combination of the drain-to-source impedance of transistor M3 and transistor M4, and these impedances have the opposite response to changes in signal OUT. Capacitor circuits C1 and C2 substantially short out transistors M4 and M6 at high frequencies such that the degeneration substantially disappears for fast transitions and the speed of latch circuit 200 is substantially unaffected by the presence of transistors M4 and M6. The negative feedback provided by transistors M4 and M6 also limits the swing of signal OUT slightly. Accordingly, voltages OUTP and OUTM are not driven fully into the positive or negative rail, effectively clamping the output. Reducing the output swing improves the response time of latch circuit 200. Logic or a half-latch without negative feedback can be used as a subsequent stage if full rail-to-rail output swing is needed.

In one embodiment, capacitor circuits C1 and C2 each include one capacitor. In other embodiments, one or both of capacitor circuits C1 and C2 may each include two or more capacitors coupled in series and/or in parallel to provide a total equivalent capacitance.

Although one embodiment of latch circuit 200 is shown in FIG. 2, many alternative embodiments are within the scope and spirit of the invention. For example, although field effects transistors (FETs) are illustrated in FIG. 2, other types of transistors may be employed, such as bipolar junction transistors (BJTs), and the like. Also, although transistors M1 and M2 are shown as n-type transistors, and transistors M3–M6 are shown as p-type transistors, in another embodiment, transistors M1 and M2 may be p-type transistors, and transistors M3–M6 may be n-type transistors.

In one embodiment, tail current source 220 is included in latch circuit 200 to limit power consumption. In another embodiment, current source 220 is not included in latch circuit 200, and differential pair 210 coupled to the rail (positive or negative, depending on whether transistors M1 and M2 are p-type of n-type transistors) rather than tail current source 220.

Figure 3:
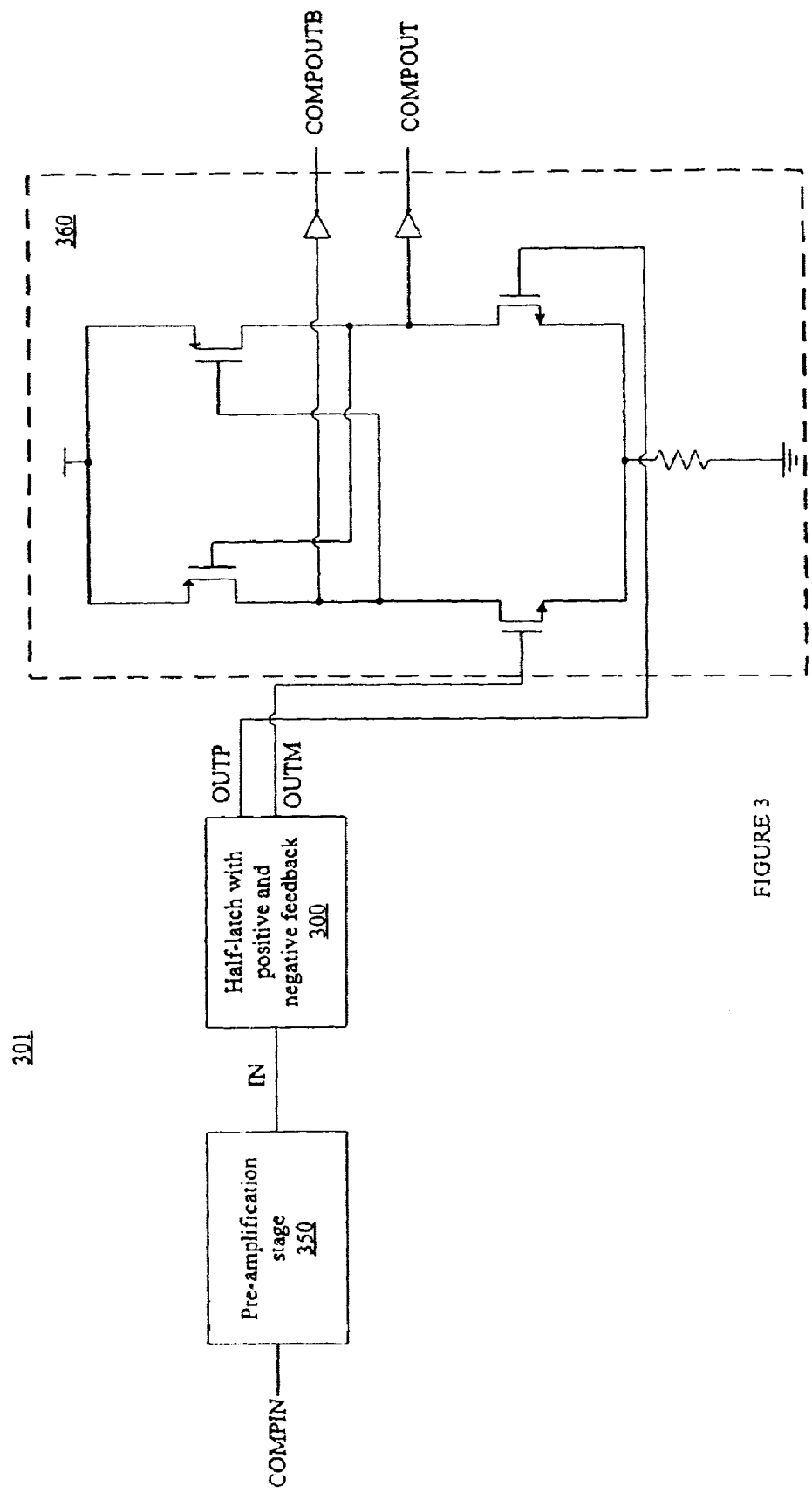
FIG. 3 shows a block diagram of an embodiment of a comparator circuit that employs an embodiment of the latch circuit of FIG. 1 or FIG. 2, arranged in accordance with aspects of the invention.

FIG. 3 shows a block diagram of an embodiment of comparator circuit 301. Comparator circuit 301 includes pre-amplification stage 350, half-latch circuit with positive and negative feedback 300, and half-latch circuit with positive feedback only 360. Latch circuit 100 of FIG. 1 or latch circuit 200 of FIG. 2 may be employed as an embodiment of half-latch circuit 300.

In operation, pre-amplification stage 350 provides signal IN based on comparator input signal COMPIN. In one embodiment, pre-amplification stage 350 provides a voltage gain of about 20 to 30. Since half-latch circuit 300 requires a relatively small overdrive voltage, only one pre-amplification stage with a relatively low gain is required.

Half-latch circuit 360, which, unlike half-latch circuit 300, does not include negative feedback, may be employed for rail-to-rail output swing, as previously discussed.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A latch circuit, comprising:
    a differential pair, including:
        a first transistor that is coupled to a first output node; and
        a second transistor that is coupled to a second output node;
    a capacitor circuit that is coupled between a first capacitor node and a second capacitor node;
    a third transistor that is coupled between the first output node and the first capacitor node, wherein the third transistor includes a gate that is coupled to the second output node; and
    a fourth transistor that is coupled between the first capacitor node and the second capacitor node, wherein the fourth transistor includes a gate that is coupled to the first output node.

2. The latch circuit of claim 1, further comprising a tail current source that is coupled to the differential pair.

3. The latch circuit of claim 1, further comprising:
    a fifth transistor that is coupled between the second output node and a third capacitor node, wherein the fifth transistor includes a gate that is coupled to the first output node; and a sixth transistor that is coupled between the third capacitor node and the second capacitor node, wherein the sixth transistor includes a gate that is coupled to the second output node.

4. The latch circuit of claim 3, further comprising:
another capacitor circuit that is coupled between the third capacitor node and the second capacitor node.

5. The latch circuit of claim 1, wherein the first transistor includes a gate, the second transistor includes a gate, the differential pair is arranged to receive a differential input signal at the gate of the first transistor and the gate of the second transistor, and wherein the differential pair is further arranged such that a first half of the differential signal is provided at the first output node, and such that a second half of the differential signal is provided at the second output node.

6. The latch circuit of claim 5, further comprising:
a pre-amplifier stage including a first input that is coupled to the gate of the first transistor, and a second input that is coupled to the gate of the second transistor.

7. The latch circuit of claim 6, further comprising:
a half-latch circuit including a first input of the half-latch circuit that is coupled to the first output node, and a second input of the half-latch circuit that is coupled to the second output node.

8. A latch circuit, comprising:
a differential pair that is arranged to receive a differential input signal;
a plurality of positive feedback transistors that is coupled to the differential pair, wherein the plurality of positive feedback transistors is arranged to provide positive feedback such that the latch circuit has two stable states, and such that a differential output signal corresponds to a first differential voltage during a first of the two stable states, and such that the differential output signal corresponds to a second differential voltage during a second of the two stable states;
a plurality of negative feedback transistors that is arranged to provide negative feedback such that a differential load impedance of the latch circuit is roughly balanced during both the first stable state and the second stable state; and
a plurality of capacitors that is arranged to substantially short each of the plurality of negative feedback transistors if a relatively fast transition from the first stable state to the second stable state occurs, and to substantially short each of the plurality of negative feedback transistors if a relatively fast transition from the second stable state to the first stable state occurs.

9. The latch circuit of claim 8, wherein:
the differential pair and the plurality of positive feedback transistors are arranged such that a first half of the differential output signal is provided at a first output node, and such that a second half of the differential output signal is provided at a second output node; and
wherein the plurality of positive feedback transistors includes:
a first positive feedback transistor that is coupled between the first output node and a first capacitor node, wherein the first positive feedback transistor includes a gate that is coupled to the second output node.

10. The latch circuit of claim 9, wherein the plurality of negative feedback transistors includes:
a first negative feedback transistor that is coupled between the first capacitor node and a second capacitor node, wherein the first negative feedback transistor includes a gate that is coupled to the first output node.

11. The latch circuit of claim 10, wherein the plurality of capacitors includes a capacitor circuit that is coupled between the first capacitor node and the second capacitor node.

12. The latch circuit of claim 10, wherein
the plurality of positive feedback transistors further includes:
a second positive feedback transistor that is coupled between the second output node and a third capacitor node, wherein the second positive feedback transistor includes a gate that is coupled to the first output node; and
wherein the plurality of negative feedback transistors further includes:
a second negative feedback transistor that is coupled between the third capacitor node and the second capacitor node, wherein the second negative feedback transistor includes a gate that is coupled to the second output node.

13. The latch circuit of claim 12, wherein the plurality of capacitors include:
a capacitor circuit that is coupled between the first capacitor node and the second capacitor node; and
another capacitor circuit that is coupled between the third capacitor node and the second capacitor node.

14. A method for providing a differential output signal, comprising:
receiving a differential input signal;
providing positive feedback such that two stable states are associated with the differential output signal, and such that the differential output signal corresponds to a first differential voltage during a first of the stable states, and such that the differential output signal corresponds to a second differential voltage during a second of the two stable states;
providing negative feedback such that a differential load impedance associated with the differential output signal is roughly balanced during at least one of the first stable state and the second stable state; and
if a relatively fast transition from the first stable state to the second stable state occurs, substantially bypassing the negative feedback.

15. The method of 14, wherein providing the negative feedback is further accomplished such that the differential output signal is roughly balanced during both the first stable state and the second stable state.

16. The method of claim 15, further comprising:
if a relatively fast transition from the second stable state to the first stable state occurs, substantially bypassing the negative feedback.

17. The method of claim 16, wherein providing the positive feedback is accomplished by employing a pair of cross-coupled transistors.

18. The method of claim 17, wherein the providing the positive feedback further includes:
providing a second half of the differential output signal to a gate of a first of the pair of cross-coupled transistor; and
providing a first half of the differential output signal to a gate of a second of the pair of cross-coupled transistors.

19. The method of claim 18, wherein providing the negative feedback includes:
providing the first half of the differential output signal to a gate of a first negative feedback transistor that is coupled between the first of the pair of the cross-coupled transistors and a power rail; and providing the second half of the differential output signal to a gate of a second negative feedback transistor that is coupled between the second of the pair of the cross-coupled transistors and the power rail.

20. The method of claim 19, wherein substantially bypassing the negative feedback is accomplished by employing a capacitor circuit that is coupled between the power rail and the first of the pair of cross-coupled transistors, and further employing another capacitor circuit that is coupled between the power rail and the second of the pair of cross-coupled transistors.

* * * * *

UNITED STATES PATENT AND TRADEMARK OFFICE
CERTIFICATE OF CORRECTION

PATENT NO. : 7,088,146 B1
APPLICATION NO. : 10/981271
DATED : August 8, 2006
INVENTOR(S) : Megaw It is certified that error appears in the above-identified patent and that said Letters Patent is hereby corrected as shown below:

In column 6, line 57, in Claim 18, after "wherein" delete "the".

Signed and Sealed this

Fifth Day of June, 2007

JON W. DUDAS
*Director of the United States Patent and Trademark Office*